United States Patent
Khatib et al.

(10) Patent No.: US 10,355,741 B2
(45) Date of Patent: Jul. 16, 2019

(54) SYSTEM AND METHOD FOR BI-DIRECTIONAL RADIO COMMUNICATION

(71) Applicant: GOODIX TECHNOLOGY INC., San Diego, CA (US)

(72) Inventors: Rami Khatib, San Diego, CA (US); Janakan Sivasubramaniam, San Diego, CA (US); Theresa Starr, San Diego, CA (US); Jared Gagne, San Diego, CA (US)

(73) Assignee: SHENZHEN GOODIX TECHNOLOGY CO., LTD., Shenzhen (CN)

( * ) Notice: Subject to any disclaimer, the term of this patent is extended or adjusted under 35 U.S.C. 154(b) by 0 days.

(21) Appl. No.: 15/798,501

(22) Filed: Oct. 31, 2017

(65) Prior Publication Data
US 2019/0132021 A1    May 2, 2019

(51) Int. Cl.
| | | |
|---|---|---|
| *H04B 1/48* | (2006.01) | |
| *H03F 3/24* | (2006.01) | |
| *H03F 3/19* | (2006.01) | |

(52) U.S. Cl.
CPC ............... *H04B 1/48* (2013.01); *H03F 3/19* (2013.01); *H03F 3/245* (2013.01);
(Continued)

(58) Field of Classification Search
CPC ........................................................... H04B 1/40
See application file for complete search history.

(56) References Cited

U.S. PATENT DOCUMENTS

| | | | | |
|---|---|---|---|---|
| 2008/0285662 A1* | 11/2008 | Dave | ........................ | H04B 3/02 375/258 |
| 2010/0035563 A1* | 2/2010 | Mikhemar | ............... | H04B 1/18 455/78 |

(Continued)

FOREIGN PATENT DOCUMENTS

CN          103378869 A       10/2013

OTHER PUBLICATIONS

European Search Report dated Apr. 2, 2019 in the corresponding EP application(application No. 18761997.8).

*Primary Examiner* — Hsinchun Liao
(74) *Attorney, Agent, or Firm* — Kilpatrick Townsend & Stockton LLP

(57) ABSTRACT

Apparatus and methods for performing wireless communications are provided. In some embodiments, an apparatus includes a transformer including a first winding, a second winding, and a third winding. The apparatus also includes a first transmitter circuit coupled with the first winding, and a second circuit coupled with the second winding. The third winding is coupled with an antenna. The first transmitter circuit is configured to transmit a first signal to the antenna via magnetic coupling between the first winding and the third winding. The second circuit is configured to tolerate without damage a second signal from the first transmitter circuit, wherein the second signal is generated from the first signal via magnetic coupling between the first winding and the second winding. A turn ratio between the first winding and the second winding can be configured to limit a voltage of the second signal to be within a pre-determined threshold.

19 Claims, 13 Drawing Sheets

(52) U.S. Cl.
CPC .... *H03F 2200/09* (2013.01); *H03F 2200/294* (2013.01); *H03F 2200/451* (2013.01)

(56) References Cited

U.S. PATENT DOCUMENTS

2011/0222443 A1* 9/2011 Khlat ...................... H03F 3/189
                                                                    370/277
2014/0146718 A1    5/2014 Mikhemar et al.

* cited by examiner

SYSTEM AND METHOD FOR BI-DIRECTIONAL RADIO COMMUNICATION

TECHNICAL FIELD

The embodiments herein generally relate to radio communication and, more particularly, to systems and methods for bi-directional radio communication.

BACKGROUND

A bi-directional radio communication system includes a transmitter, a receiver, and an antenna. The transmitter can receive data carrying certain information and general electrical signals based on the data, and transmit the electrical signals to the antenna. The antenna can convert the electrical signals received from the transmitter into radio signals. The radio signals can propagate, in the form of radio waves, over a distance to transmit the information. The antenna can also receive radio signals and convert that into electrical signals, and provide the converted electrical signals to the receiver. The receiver can amplify and filter the electrical signals received from the antenna, and provide the electrical signals to other circuit blocks to extract information. The transmitter and the receiver can be integrated on an integrated circuit (IC) chip, whereas the antenna can be an off-chip component and not part of the IC chip.

In the communication system, the antenna can be coupled with the transmitter and the receiver via a fixed electrical connection. Each of the transmitter and the receiver can be individually controlled to access the antenna. For example, when the transmitter is transmitting electrical signals to the antenna via the fixed electrical connection, the receiver can be either disabled or controlled to discard the electrical signals from the transmitter. Also, when the receiver is receiving electrical signals from the antenna via the fixed electrical connection, the transmitter can be controlled to not transmit any signal to the fixed electrical connection.

Such an arrangement works for a communication protocol that allows transmission and reception of communication data over a common signal path at different times, such as time-division multiplexing. However, such an arrangement can expose the receiver to the electrical signals transmitted by the transmitter, which can have undesirable consequences. For example, the transmitter may be designed to transmit signals of relatively large voltage swing. The voltage swing can be designed to cover for attenuation of transmitted signal power, as the signal propagates within the space. The voltage level of the transmitted signal may cause high voltage stress to the transistor devices of the receiver, which can lead to device breakdown. As a result, the reliability of the receiver can be degraded.

Instead of a fixed electrical connection, a transmitter/receiver (T/R) switch can be provided to allow one of transmitter or the receiver to be electrically connected to the antenna. The T/R switch can include a first transistor that controls the electrical connection between the antenna and the transmitter, and a second transistor that controls the electrical connection between the antenna and the receiver. The two transistors can be controlled to operate in tandem. When the transmitter transmits electrical signals to the antenna via the first switch, the receiver can be electrically isolated from the antenna by the second switch. When receiving electrical signals from the antenna via the second switch, the transmitter can be electrically isolated from the antenna by the first switch. The T/R switch is typically also an off-chip component.

SUMMARY

Certain embodiments are described that provide techniques to facilitate wireless communication. According to certain aspects of the disclosure, an apparatus is provided. The apparatus includes a transformer including a first winding, a second winding, and a third winding. The apparatus also includes a first transmitter circuit coupled with the first winding, and a second circuit coupled with the second winding. The third winding is coupled with an antenna. The first transmitter circuit is configured to transmit a first signal to the antenna via magnetic coupling between the first winding and the third winding. The second circuit is configured to tolerate without damage a second signal from the first transmitter circuit, wherein the second signal is generated from the first signal via magnetic coupling between the first winding and the second winding. A turn ratio between the first winding and the second winding can be configured to limit a voltage of the second signal to be within a pre-determined threshold.

In some embodiments, the second circuit comprises at least a receiver circuit; wherein the receiver circuit is configured to receive a third signal from the antenna via magnetic coupling between the second winding and the third winding. The second circuit may further comprise a switch between the second winding and a ground node; wherein the switch is turned off to disconnect the second winding from the ground node when the first transmitter circuit transmits the first signal.

In some embodiments, the second circuit comprises at least a second transmitter circuit; wherein the second transmitter circuit is configured to transmit a fourth signal to the antenna via magnetic coupling between the second winding and the third winding. The second circuit may further comprise a switch between the second winding and a ground node, wherein the switch is turned off to disconnect the second winding from the ground node when the first transmitter circuit transmits the first signal. The first transmitter circuit may be configured to transmit the first signal as a first varying signal with a first maximum voltage; wherein the second transmitter circuit is configured to transmit the fourth signal as a second varying signal with a second maximum voltage; wherein the first maximum voltage is larger than the second maximum voltage.

In some embodiments, the transformer is a balun transformer; and wherein the first transmitter circuit comprises a fully differential output stage.

In some embodiments, the pre-determined threshold is set based on a maximum voltage of the first signal and an operational voltage of second circuit. The operational voltage may be determined based on a predetermined voltage stress tolerance of transistor devices of the second circuit.

According to certain aspects of the disclosure, an apparatus is provided. The apparatus comprises a transformer including a first winding, a second winding, and a third winding, the third winding being coupled with an antenna. The apparatus may also include a first transmitter circuit coupled with the first winding, a second circuit coupled with the second winding, and a controller circuit. The controller circuit is configured to determine a distance from the apparatus to another device, determine a target strength of a first signal to be transmitted at the antenna based on the distance, and select, based on the target strength, the first transmitter circuit to transmit the first signal. The controller circuit is further configured to transmit data representing a first signal to the first transmitter circuit to enable the first transmitter circuit to transmit the first signal to the antenna via magnetic coupling between the first winding and the third winding. The second circuit may be configured to tolerate without damage a second signal from the first transmitter circuit, wherein the second signal is generated from the first signal via magnetic coupling between the first winding and the second winding. Moreover, a turn ratio between the first winding and the second winding can be configured to limit a voltage of the second signal to be within a pre-determined threshold.

In some embodiments, the controller circuit is configured to determine the distance based on receives signal strength information (RSSI) received from the another device. The controller circuit may be configured to determine a free-space path loss (FSPL) ratio based on the distance, determine a required output swing based on the FSPL and a required received signal strength, and select the first transmitter circuit based on the required output swing.

In some embodiments, the second circuit further comprises a receiver circuit coupled with the second winding. The second circuit may further comprise a switch between the second winding and a ground node; wherein the switch is turned off to disconnect the second winding from the ground node when the first transmitter circuit transmits the first signal.

In some embodiments, the first transmitter circuit is configured to transmit the first signal as a first varying signal with a first maximum voltage. The second circuit is configured to transmit or receive the second signal as a second varying signal with a second maximum voltage. The first maximum voltage is larger than the second maximum voltage.

In some embodiments, the transformer is a balun transformer. The first transmitter circuit comprises a fully differential output stage. The pre-determined threshold can be set based on a maximum voltage of the first signal and an operational voltage of second circuit. The operational voltage can be determined based on a predetermined voltage stress tolerance of transistor devices of the second circuit.

According to certain aspects of the present disclosure, a method of transmitting radio signals is provided. The method can be performed by a communication system comprising a transformer including a first winding, a second winding, and a third winding, the third winding being coupled with an antenna, a first transmitter circuit coupled with the first winding, and a second circuit coupled with the second winding. The method may comprise: determining a distance from the communication system to another device, determining a target strength of a first signal to be transmitted at the antenna based on the distance, selecting, based on the target strength, the first transmitter circuit to transmit a first signal, and transmitting data representing a first signal to the first transmitter circuit to enable the first transmitter circuit to transmit the first signal to the antenna via magnetic coupling between the first winding and the third winding. In some embodiments, the method further comprises receiving received signal strength information (RSSI) from the another device via the second circuit and via the second winding; wherein the distance is determined based on the RSSI.

BRIEF DESCRIPTION OF THE DRAWINGS

Various embodiments in accordance with the present disclosure will be described with reference to the drawings, in which.

DETAILED DESCRIPTION

Figure 1A:
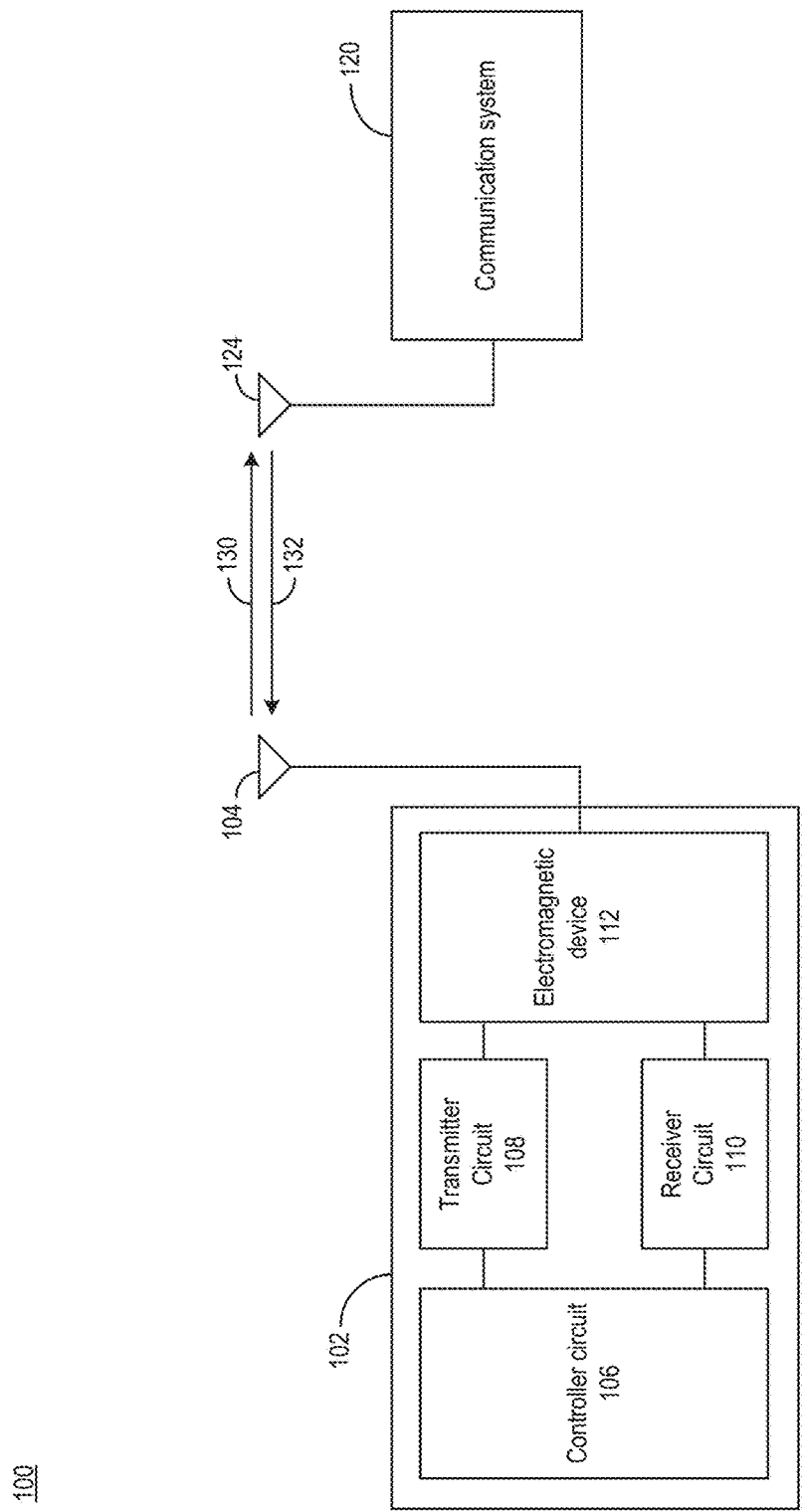
FIGS. 1A-1D illustrate an example of a bi-directional communication system, according to certain aspects of the disclosure.

In the following description, various embodiments will be described. For purposes of explanation, specific configurations and details are set forth in order to provide a thorough understanding of the embodiments. However, it will also be apparent to one skilled in the art that the embodiments may be practiced without the specific details. Furthermore, well-known features may be omitted or simplified in order not to obscure the embodiments being described.

A bi-directional radio communication system includes a transmitter, a receiver, and an antenna. The transmitter and the receiver can be integrated on an integrated circuit (IC) chip, whereas the antenna can be an off-chip component and not part of the IC chip. The communication system may include an off-chip T/R switch to control access to the antenna between the transmitter and the receiver, and to provide electrical isolation between the transmitter and the receiver.

The use of off-chip T/R switch can degrade the performance of the communication system. For example, the T/R switch can introduce significant resistance and parasitic capacitance to the signal paths between the antenna and the transmitter, and between the antenna and the receiver, which can reduce the operational bandwidth of the system. Moreover, impedance mismatches at the respective interfaces between the T/R switch and the transmitter, and between the T/R switch and the receiver, can also lead to insertion loss in the signal paths. Although the T/R switch can provide electrical isolation between the transmitter and the receiver (e.g., to mitigate the risk of exposing the receiver to the high-voltage electrical signals generated), the T/R switch can introduce significant performance degradation to the communication system as a whole.

Techniques are described herein for providing shared access to the antenna between the transmitter and the receiver via magnetic coupling. In some embodiments, a transformer with at least a first winding, a second winding, and a third winding can be used to provide the shared access. In those embodiments, the first winding can be electrically connected to a transmitter; the second winding can be electrically connected to a receiver; and the third winding can be electrically connected to an antenna. In those embodiments, the transmitter can transmit a signal to the antenna via magnetic coupling between the first winding and the third winding. In those embodiments, the receiver can also receive a signal from the antenna via the magnetic coupling between the second winding and the third winding. In those embodiments, the receiver may receive a signal from the transmitter via the magnetic coupling between the first winding and the second winding. In those embodiments, the turn ratio between the first winding and the second winding can be set such that the signal received by the receiver from the transmitter can be limited to a pre-determined threshold. As an illustrative example, if the transmitter transmits a signal with maximum voltage at 3 v, and the transistors of the receiver is designed to operate at 1 v, the turn ratio between the first winding and the second winding can be set at approximately 3.3:1. With this turn ratio, the signal received by the receiver from the transmitter can be limited at 1 v.

It should be understood the embodiments described above are not intended to be limiting. In some other embodiments, the number of windings in the transformer in accordance with the disclosure can be more or less than three. For example, the transformer in accordance with the disclosure can have four windings with a turn ratio 4:1:1:1 among the four windings. Other examples are contemplated.

Using a transformer, instead of transistors, to provide shared access to the antenna has advantages. First, the resistance and capacitance of a transformer are typically smaller than those of a T/R switch. Second, the transformer can be integrated as part of the IC chip that includes the transmitter and the receiver. All these can reduce the resistance, capacitance, as well as insertion loss along the signal paths between the antenna and the transmitter/receiver, and can improve the performance of the communication system. The turn ratio between the windings connected to the receiver and the transmitter can be configured to reduce the high-voltage stress on the transistor devices of the receiver. Therefore, the reliability of the receiver, and the reliability of the communication system as a whole, can be improved.

FIG. 1A illustrates a wireless system 100 in which various embodiments can be used. In some examples, wireless system 100 can include a short-range communication system such as, for example, a Bluetooth™ Low Energy (BLE) system. As shown in FIG. 1, wireless system 100 can include a first communication system 102, a second communication system 120, and/or any other components. As shown, first communication system 102 can be connected to an antenna 104, whereas second communication system 120 can be connected to an antenna 124. Via antennas 104 and 124, first communication system 102 and second communication system 120 can perform wireless communication. For example, first communication system 102 can be part of a silicon chip housed within a wireless headset, whereas second communication system 120 can be a part of a phone. In that example, a user can speak to the wireless headset, which convert the audio signals into radio signals 130. First communication system 102 can then transmit radio signals 130, via antenna 104. Second communication system 120 can receive radio signals 130 via antenna 124, and provide the received signals to other processing circuits of the phone for transmission to the cellular network. Moreover, first communication system 102 can also receive radio signals 132 from second communication system 120 via antenna 124, and provide the received signals to other processing circuits of the wireless headset. The wireless headset can convert the received signals to audio signals, and output the audio signals to the user.

As illustrated in FIG. 1A, first communication system 102 can include a controller circuit 106, a transmitter circuit 108, a receiver circuit 110, an electromagnetic device 112, and/or any other components. Controller circuit 106 can act as an interface between transmitter circuit 108/receiver circuit 110 and any other processing logics (not illustrated in FIG. 1). For example, controller circuit 106 can receive data, convert the data into electrical signals, and provide the signals to transmitter circuit 108 for transmission. Controller circuit 106 can also receive electrical signals from receiver circuit 110, convert the received signals into data, and forward the data to the processing logics. As to be discussed in more details below, transmitter circuit 108 can transmit the electrical signals received from controller circuit 106 to antenna 104 via electromagnetic device 112. Receiver circuit 110 can also receive electrical signals from antenna 104 via electromagnetic device 112, and transmit the received signals to controller circuit 106. Controller circuit 106 can also control other operations of transmitter circuit 108 and receiver circuit 110. For example, when transmitter circuit 108 is transmitting signals to antenna 104, controller circuit 106 can disable receiver circuit 110 (or discard the output of receiver circuit 110). Moreover, when receiver circuit 110 is receiving signals from antenna 104, controller circuit 106 can disable transmitter circuit 108, or fix the input to transmitter circuit 108 at a static voltage, so that transmitter circuit 108 does not generate a signal at antenna 104.

Transmitter circuit 108 can include circuitries for transmitting electrical signals to antenna 104. Such circuitries may include, for example, one or more power amplifiers. Examples of the one or more power amplifiers may include a multi-stage solid-state amplifier, with each stage comprising one or more transistors and inductors. The transistors of each stage can amplify electrical signals, while the inductors can be used for DC biasing, filtering, and impedance matching. The transistors can include a MOSFET (metal-oxide semiconductor field effect transistor), a BJT (bipolar junction transistor), and/or any other type of transistor.

Figure 1B:
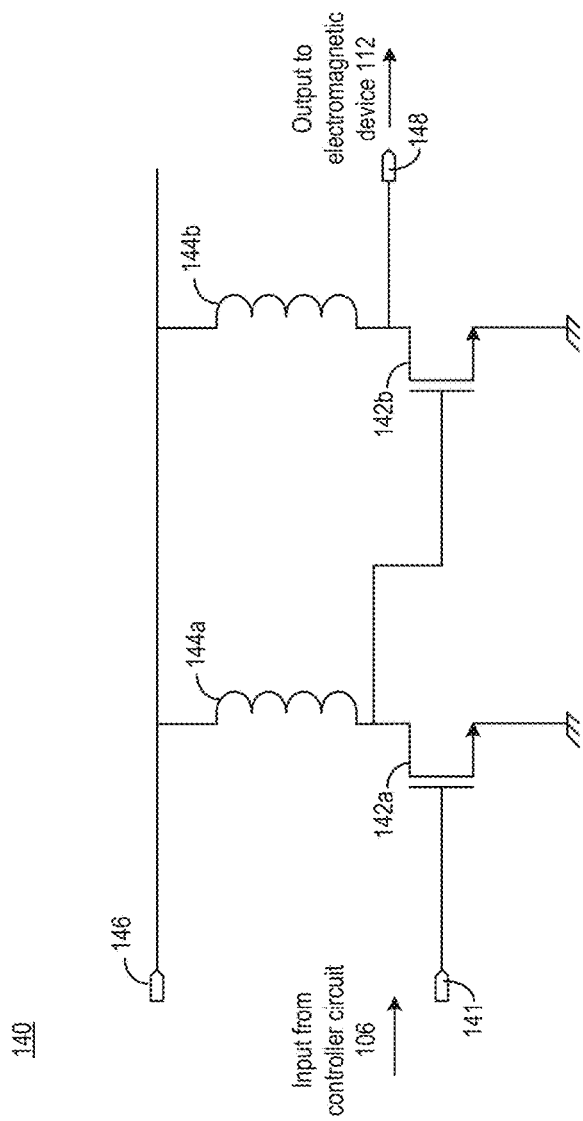

The multi-stage solid-state amplifier can be single-ended or fully differential. FIG. 1B illustrates an example of a single-ended two-stage power amplifier 140, which can be part of transmitter circuit 108. Each stage of power amplifier 140 includes an N-type transistor (e.g., one of transistors 142a and 142b) and a choke inductor (e.g., one of choke inductors 144a and 144b). Each stage has a single input and a single output. The input of the first stage (gate of transistor 142a, connected to input port 141) can receive a voltage from controller circuit 106, and the output of the first stage can be connected to the input of the second stage (gate of transistor 142b). The output of the second stage (drain of transistor 142b, connected to output port 148) can be connected to, for example, electromagnetic device 112. Electromagnetic device 112 can generate a signal at antenna 104. The signal can be derived from the output of the amplifier via magnetic coupling, as to be discussed in more details below. Choke inductors 144a and 144b can be connected to an output bias voltage 146. Output bias voltage 146, together with the maximum output voltage swing of power amplifier 140, can set the maximum output voltage of the amplifier. For example, if the maximum output voltage swing is +/−1 v, with output bias voltage 146 set at 2 v, the output voltage range of power amplifier 140 can be between 1-3 v, with the maximum output voltage being 3 v.

Figure 1C:
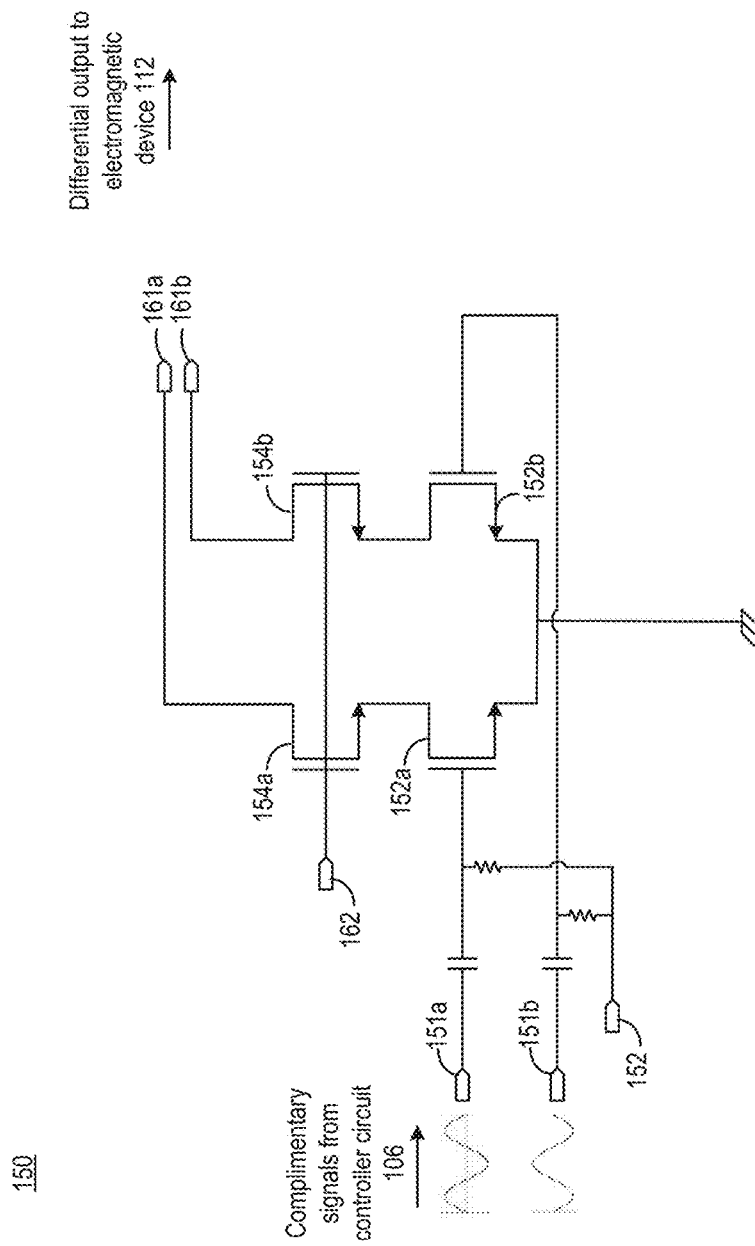

FIG. 1C illustrates an example of a fully differential power amplifier 150, which can also be part of transmitter circuit 108. Power amplifier 150 includes a pair of N-type transistors (e.g., MOSFET, BJT, etc.) configured as a differential pair (e.g., transistors 152a and 152b). Each input of the differential pairs can be coupled with a port 152 via a resistor-capacitor network. Port 152 can be coupled with a voltage source to set an input DC level for the differential pairs. The differential pair may also be coupled with a pair of transistors 154a and 154b configured as cascode devices, with the gate terminals of transistors 154a and 154b being coupled with another DC voltage sources via port 162. Drain terminals 161a and 161b of the pair of transistors 154a and 154b are the differential outputs of power amplifier 150. Drain terminals 161a and 161b can be coupled with electromagnetic device 112 (e.g., a balun transformer), which provide the RF choke for power amplifier 150. Compared with single-ended power amplifier 140, fully differential power amplifier 150 can provide cancellation of common-mode noise (e.g., noise that appears on both of the differential inputs), interference, even-order harmonics, etc., which can improve the fidelity of the transmitted signal.

Figure 1D:
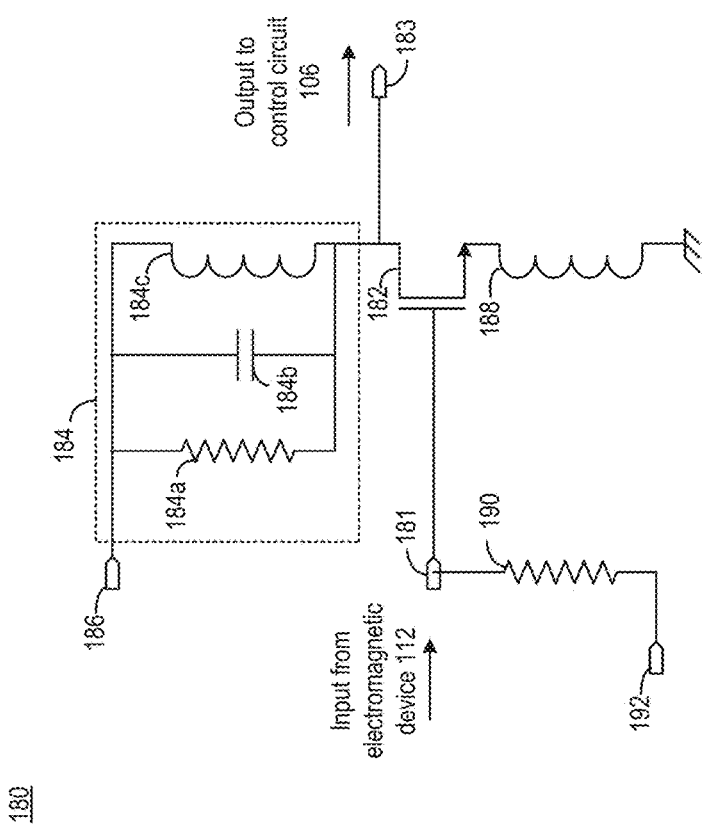

Referring back to FIG. 1A, receiver circuit 110 can include circuitries for processing electrical signals received from antenna 104 (via electromagnetic device 112). Such circuitries may include, for example, a low noise amplifier. FIG. 1D illustrates an example of a low noise amplifier 180, which in this example comprises an N-type transistor 182 configured as an amplifier, and a filter tank 184 including a resistor 184a, a capacitor 184b, and an inductor 184c. Filter tank 184 can be connected to a supply voltage 186 which can set the maximum output voltage of low noise amplifier 180. Low noise amplifier 180 can include an inductor 188 configured to provide inductive degeneration to N-type transistor 182 for impedance matching. The gate of transistor 182 is connected to a bias resistor 190, which is connected to a bias voltage 192, to set the DC operating point of transistor 182. Low noise amplifier 180 can receive electrical signals from electromagnetic device 112 at the gate of transistor 182 (connected to input port 181), filter and amplify the received signal, and output the processed signal at the drain of transistor 182 (connected to output port 183). Receiver circuit 110 may include other circuits, such as frequency converter (not illustrated in the figures), to process the received signal before transmission to control circuit 106.

Referring back to FIG. 1A, electromagnetic device 112 can allow shared access to antenna 104 between transmitter circuit 108 and receiver circuit 110. For example, electromagnetic device 112 can receive an electrical signal from the output port of transmitter circuit 108, and generate an electrical signal at antenna 104 through magnetic induction based on the received signal. Electromagnetic device 112 can receive an electrical signal from antenna 104, and generate an electrical signal at the input port of receiver circuit 110 through magnetic induction based on the received signal. In some embodiments, electromagnetic device 112 can be a transformer with multiple windings. When an alternating voltage is applied across one of the windings, an alternating current flows through the winding. The alternating current generates a magnetic flux. The magnetic flux will flow through the other windings, and induce an alternating electrical voltage in each of those windings. An alternating current may also flow in each of those windings if they are connected to loads. On the other hand, no magnetic flux will be created if static voltages are applied across the windings.

Figure 2A:
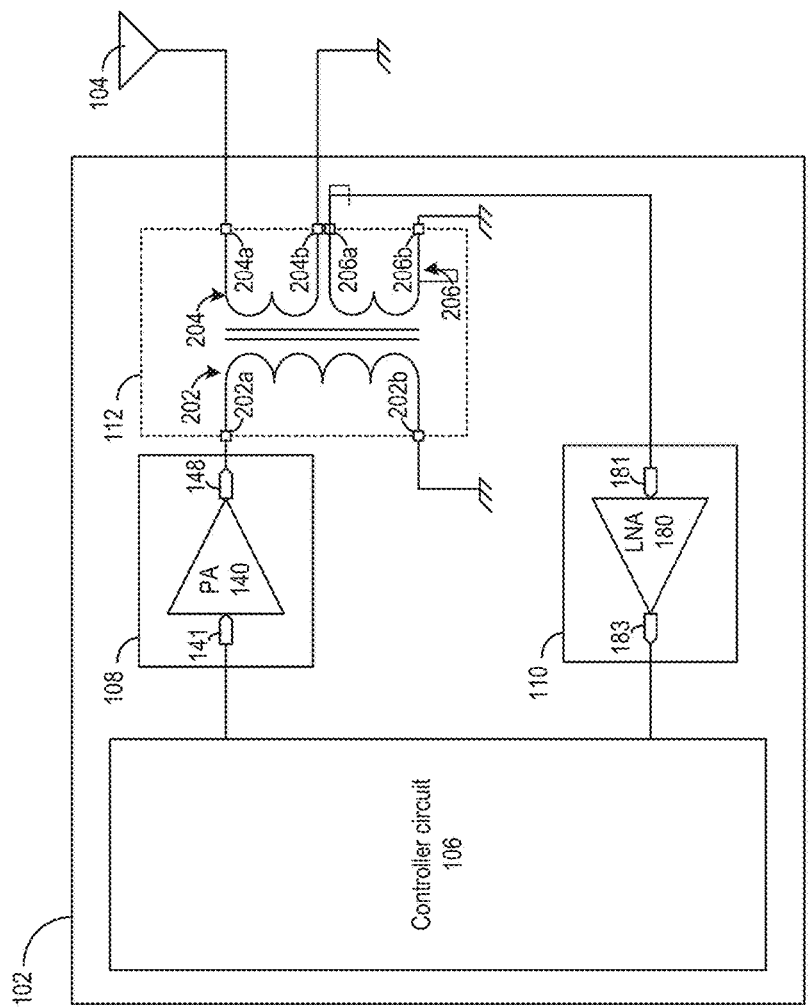
FIGS. 2A-2C illustrate examples of components of the bi-directional communication system of FIG. 1A, according to certain aspects of the disclosure.

Reference is now to made to FIG. 2A, which illustrates an example of the components of first communication system 102 of FIG. 1A according to certain aspects of the disclosure. As illustrated in FIG. 2A, transmitter circuit 108 includes power amplifier 140, whereas receiver circuit 110 includes low noise amplifier 180. Both of input port 141 of power amplifier 140 and output port 183 of low noise amplifier 180 are connected to controller circuit 106. Moreover, electromagnetic device 112 includes a transformer with a winding 202, a winding 204, and a winding 206. Each winding has two bi-directional ports. For example, winding 202 has ports 202a and 202b, winding 204 has ports 204a and 204b, whereas winding 206 has ports 206a and 206b. In the example of FIG. 2A, winding 202 is connected to output port 148 of power amplifier 140 at port 202a, whereas port 202b is connected to ground. Moreover, winding 204 is connected to antenna 104 at port 204a, whereas port 204b is connected to ground. Further, winding 206 is electrically connected to input port 181 of low noise amplifier 180 at port 206a, whereas port 206b is connected to ground.

The magnetic coupling among windings 202, 204, and 206 can enable shared access to antenna 104 between power amplifier 140 and low noise amplifier 180. For example, when first communication system 102 is in the process of receiving data (e.g., from second communication system 120), controller circuit 106 can disable power amplifier 140, or send a static signal to the amplifier, to prevent power amplifier 140 from inducing a signal at winding 204 (and antenna 104). Antenna 104 can receive radio signals from second communication system 120, and convert the received radio signals into an alternating voltage. The alternating voltage is applied across winding 204, which can generate an alternating magnetic flux. As the alternating magnetic flux flows through windings 202 and 206, a scaled version of the alternating voltage can be induced across each of windings 202 and 206. Low noise amplifier 180 can generate an output at output port 183 based on the alternating voltage induced at winding 206, and provide the output to controller circuit 106. The alternating voltage induced at winding 202 also has insignificant effect on power amplifier 140, since the amplifier is not transmitting data.

On the other hand, when first communication system 102 is in the process of transmitting data (e.g., to second communication system 120), power amplifier 140 receives data from controller circuit 106 via input port 141, and generates an alternating voltage at output port 148. The alternating voltage is applied across winding 202, which generates an alternating magnetic flux. As the alternating magnetic flux flows through windings 204 and 206, a scaled version of the alternating voltage can be induced across each of windings 204 and 206. Antenna 104 can convert the alternating voltage induced at winding 204 into radio signals, and transmit the radio signals. Low noise amplifier 180 may also generate an output at output port 183 based on the alternating voltage induced at winding 206, which can be discarded by controller circuit 106 as it transmits data to power amplifier 140. Controller circuit 106 may also disable low noise amplifier 180 by, for example, disabling supply voltage 186, when controller circuit 106 transmits data to power amplifier 140.

Although controller circuit 106 can be configured to discard the output by low noise amplifier 180 when transmitting data to power amplifier 140, the alternating voltage induced at winding 206 may expose transistor devices of low noise amplifier 180 (e.g., transistor 182 of FIG. 1D) to high voltages. For example, referring to FIG. 2B, the output voltage range of power amplifier 140 can be between 0 v to 3.3 v. Power amplifier 140 may be configured to output that voltage swing to account for attenuation of signal power as it travels through the space. If the turns ratio between windings 202 and 206 is 1:1, a 0-3.3 v alternating voltage can be introduced at winding 206, as well as at the gate of transistor 182.

The 0-3.3 v alternating voltage can cause high voltage stress to transistor 182. Typically a low noise amplifier can be constructed with transistor devices that provide higher gain and bandwidth, to improve the sensitivity and operational frequency range. These transistor devices typically have a relatively low operational voltage (e.g., 1 v) and have low voltage stress tolerance. For example, transistor 182 may be designed to receive a voltage threshold of 1 v across the gate and source terminals, across the gate and drain terminals, and across the drain and source terminals. With the gate of transistor 182 driven by a 0-3.3 v alternating voltage, transistor 182 may be exposed to high voltage stress which can lead to, for example, oxide breakdown, hot electron effect, etc. All these can lead to device breakdown and rapid degradation of the performance of the device.

Figure 2B:
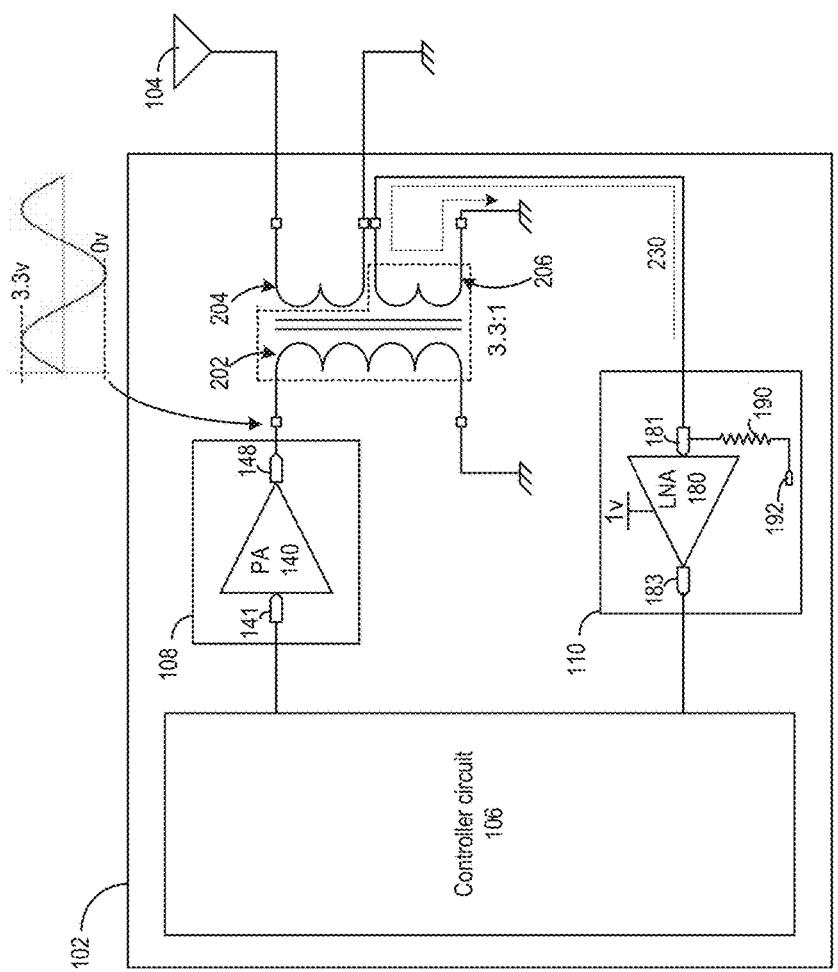

For mitigating the high voltage stress caused by power amplifier 140, a turn ratio between windings 202 and 206 can be set to reduce the maximum voltage induced at winding 206. For example, as illustrated in FIG. 2B, the turns ratio between windings 202 and 206 can be set at about 3.3:1. With the output voltage of power amplifier 140 within a range of 0 v to 3.3 v, and with the 3.3:1 turns ratio, the induced voltage at winding 206 can be limited to within a range of 0 v to 1 v, which is within the operational voltage range of transistor 182. With such an arrangement, the exposure of transistor 182 to high voltage stress can be reduced, which in turn can improve the reliability of low noise amplifier 180. On the other hand, the turns ratio between winding 204 (connected to antenna 104) and winding 206.

Although induced voltage at winding 206 can be reduced by the turns ratio to reduce voltage stress on low noise amplifier 180, the induced voltage may still cause other undesirable effects, such as leakage current. For example, as discussed above, the gate of transistor 182 (and input port 181 of low noise amplifier 180) may be connected to bias voltage 192, via bias resistor 190, to set the DC operating point. As illustrated in FIG. 2B, winding 206 can form a complete current path 230 from bias voltage 192 to ground. With the induced voltage, a leakage current may flow along current path 230. The leakage current is undesirable because it leads to power loss at receiver circuit 110, at a time when transmitter circuit 108 is transmitting via antenna 104, and receiver circuit 110 is not performing the receiver function.

Figure 2C:
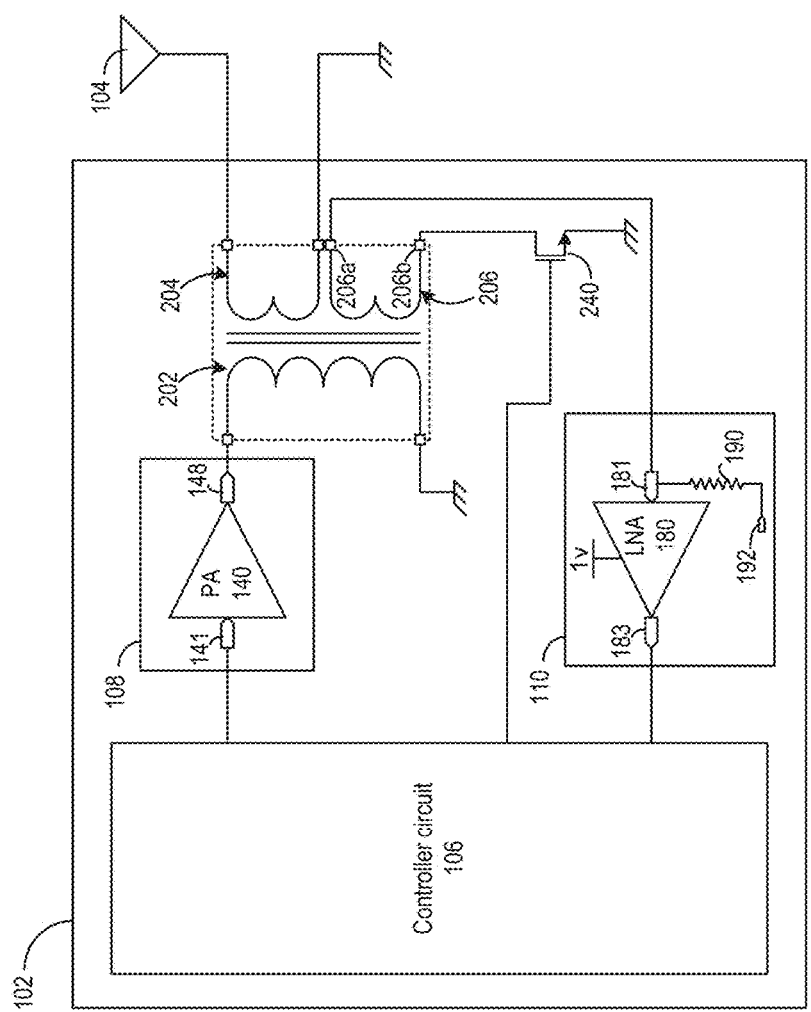

For reducing leakage current and the resulting power loss, a switch can be provided to break the current path at winding 206 when transmitter circuit 108 is transmitting via antenna 104. Reference is now made to FIG. 2C, which illustrates an example of first communication system 102 with the switch provided. As illustrated in FIG. 2C, first communication system 102 includes a switch 240 which includes an N-type transistor, such as a MOS transistor, a BJT transistor, etc. The drain of the transistor can be connected to port 206b of winding 206, whereas the source of the transistor can be connected to the ground. When the transistor is switched off, the current path 230 between bias voltage 192 to ground can be severed, and the flow of leakage current can be prevented. The transistor of switch 240 can be of the same type of transistors as transistor 182 of low noise amplifier 180, since they are exposed to the same level of voltage stress. Therefore, switch 240 can be integrated with receiver circuit 110 (and with transmitter circuit 108 and controller circuit 106) on a single silicon chip.

Controller circuit 106 can control the turning on and off of switch 240. Controller circuit 106 can turn off switch 240, when transmitter circuit 108 is transmitting signals to antenna 104 via magnetic coupling between windings 202 and 204, which also induces an unwanted signal at winding 206. Controller circuit 106 can disable receiver circuit 110, and/or discard the output of receiver circuit 110 generated based on the induced voltage at winding 206. Controller circuit 106 can turn off switch 240 to prevent flow of leakage current in winding 206 due to the induced voltage. Controller circuit 106 can turn on switch 240 when receiver circuit 110 is processing signals from antenna via magnetic coupling between windings 204 and 206.

Figure 3A:
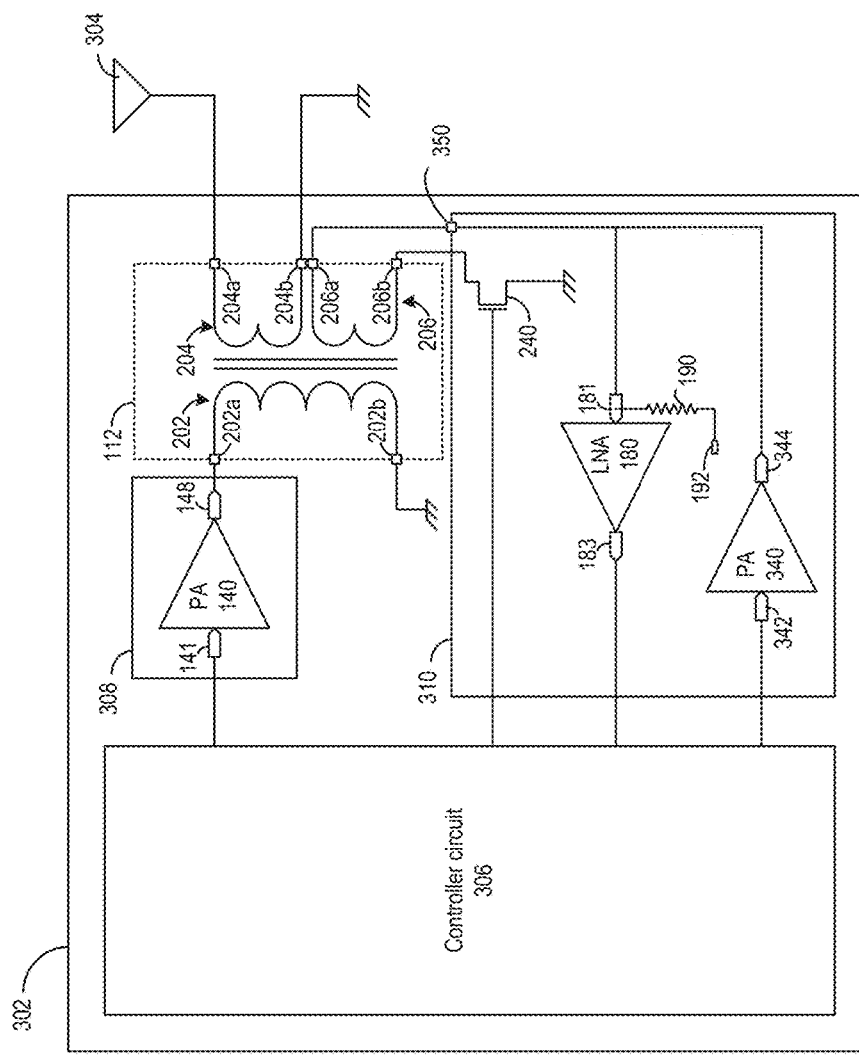
FIGS. 3A-3C illustrate another example of a bi-directional communication system, according to certain aspects of the disclosure.

Reference is now made to FIG. 3A, which illustrates an example of a communication system 302 according to the disclosure. Communication system 302 can be connected with an antenna 304 to perform bi-directional communication with another device (e.g., second communication system 120 of FIG. 1A). Communication system 302 can be part of a BLE silicon chip housed within a wireless headset, and can replace first communication system 102 of FIG. 1A. As illustrated in FIG. 3A, communication system 302 includes a controller circuit 306, a high voltage circuit 308, a low voltage circuit 310, and electromagnetic device 112.

High voltage circuit 308 may include power amplifier 140 which outputs an alternating voltage between 0-3.3 v. Low voltage circuit 310 may include low power amplifier 180 that operates at 1 v, a low voltage power amplifier 340, and switch 240. Low voltage power amplifier 340 can be of the same topology as single-ended power amplifier 140 of FIG. 1B. Low voltage power amplifier 340 can also be of the same topology as fully differential power amplifier 150 of FIG. 1C, and includes at least an input port 342 and an output port 344. Low voltage power amplifier 340 can output an alternating voltage between 0-1 v. Both input port 181 of low noise amplifier 180 and output port 344 of low voltage power amplifier 340 can be connected together to form a bi-directional port 350. Low power amplifier 180, low voltage power amplifier 340, and switch 240 can be constructed with transistor devices with the same voltage stress tolerance (e.g., with the same operational voltage of 1 v).

In this example, electromagnetic device 112 includes winding 202 (with ports 202a and 202b), winding 204 (with ports 204a and 204b), and winding 206 (with ports 206a and 206b). Power amplifier 140 can be connected to port 202a of winding 202, whereas port 202b can be connected to ground. Antenna 304 can be connected to port 204a of winding 204, whereas port 204b can be connected to ground. Port 350 of low voltage circuit 310 (connected to input port 181 of low noise amplifier 180 and output port 344 of low voltage power amplifier 340) can be connected to port 206a of winding 206, whereas port 206b of winding 206 can be connected to the drain of switch 240, which can control a current path between port 206b and ground.

In some embodiments, communication system 302 can provide multiple-power-level radio signal transmission by controlling the data supplied to power amplifier 140 and low voltage power amplifier 340, and by controlling switch 240. For example, in a high power transmission mode, controller circuit 306 can provide data to power amplifier 140 for transmission, which can convert the data into electrical signals that toggle between 0-3.3 v, and output the electrical signals to antenna 304 via magnetic coupling between windings 202 and 204. Controller circuit 306 can also disable low voltage power amplifier 340, or transmit a static signal (i.e., DC) to low voltage power amplifier 340, to prevent low voltage power amplifier 340 from inducing a signal at antenna 104. Control circuit 306 can also turn off switch 240 to avoid power loss due to induced current, as discussed above. In a low power transmission mode, controller circuit 306 can provide data to low voltage power amplifier 340 for transmission, which can convert the data into electrical signals that toggle between 0-1 v, and output the electrical signals to antenna 304 via magnetic coupling between windings 206 and 204. Controller circuit 306 can also turn on switch 240, to allow low voltage power amplifier 340 to output an alternating voltage at winding 206. Switch 240 is also turned on when communication system 302 is in the process of receiving data from antenna 104, so that low noise amplifier 180 can receive signals from antenna 104 via magnetic coupling between windings 204 and 206.

Communication system 302 can transmit radio signals of different power levels to conserve power while maintaining the fidelity of the transmitted signal at the recipient device (e.g., second communication system 120). As discussed above, a radio signal may experience attenuation as it travels in the space. The degree of attenuation can be quantified based on a ratio between the power of the radio signal at antenna 304 and the power of the radio signal as received at the recipient device. The degree of attenuation (also known as free-space path loss (FSPL)) can be defined according to following equation:

$$FSPL = \left(\frac{4\pi d}{\lambda}\right)^2 \quad \text{(Equation 1)}$$

Here, π is the mathematical constant (3.1416), d is the distance from antenna 304 that transmits the signal, whereas λ is the wavelength of the radio signal.

As discussed above, the output swing of a power amplifier can be configured to account for attenuation of radio signal power as the signal travels in the space. For example, the output swing can be set such that the power level of the radio signal received at the recipient device, after the attenuation, remains above a certain threshold. Controller circuit 306 may determine a distance to be travelled by the radio signal, and FSPL based on the distance. Based on the FSPL, and the available output swings at the transmitter circuits, controller circuit 306 may determine a set of expected received signal power levels at recipient device. Controller circuit 306 can then select the output swing (and the transmitter circuit that generates the selected output swing) based on whether the corresponding received signal power level exceeds a threshold. For example, if communication system 302 and second communication system 120 are separated by a long distance, controller circuit 306 may select power amplifier 140 to output a signal of voltage swing 0-3.3 v to antenna 304. On the other hand, if the systems are separated by a shorter distance, controller circuit 306 may select low voltage power amplifier 340 to output a signal of voltage swing 0-1 v to antenna 304, to conserve power.

Controller circuit 306 can determine the travel distance of power amplifier output signal based on a distance between the system and a target receiving device of the signal. Referring to the example of FIG. 1A, the travel distance can be a distance between first communication system 102 (or communication system 302) and second communication system 120. Controller circuit 306 can first transmit a signal of predetermined swing to second communication system 120, and then receive signal strength information (RSSI) from second communication system 120. According to Equation 1, and the ratio between the transmitted power and RSSI, controller circuit 306 can estimate the distance between the two systems. Based on the distance, controller circuit 306 can further determine a set of received signal powers at second communication system 120 for each of the available transmitter output swings. Controller circuit 306 can then select the output swing that provides a received signal power level that exceeds a threshold, and configure the amplifiers as well as switch 240 accordingly as discussed above.

Figure 3B:
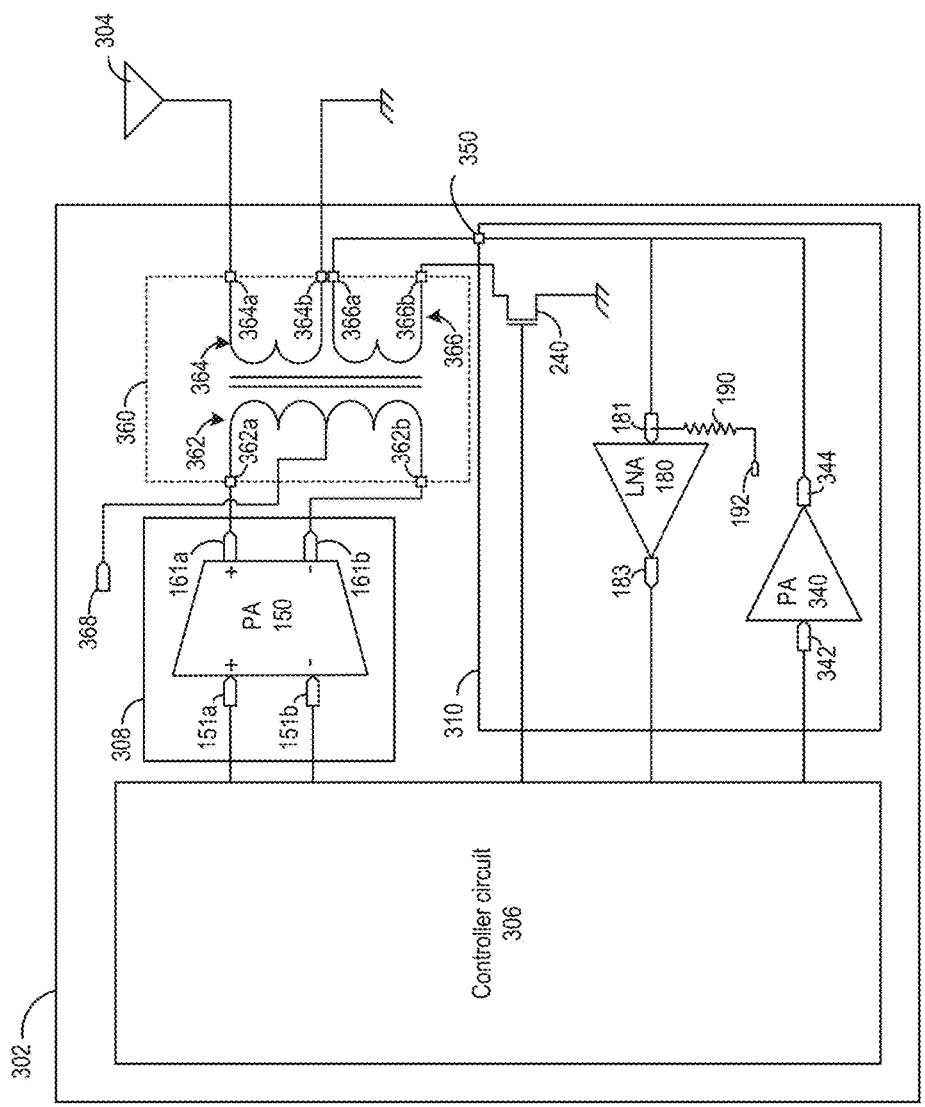
Figure 3C:
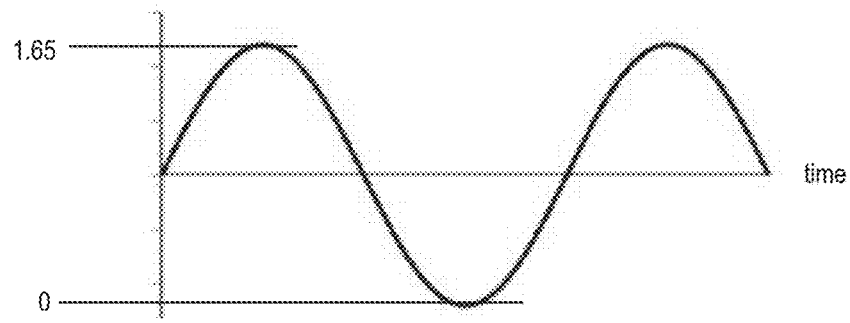
Figure 3C:
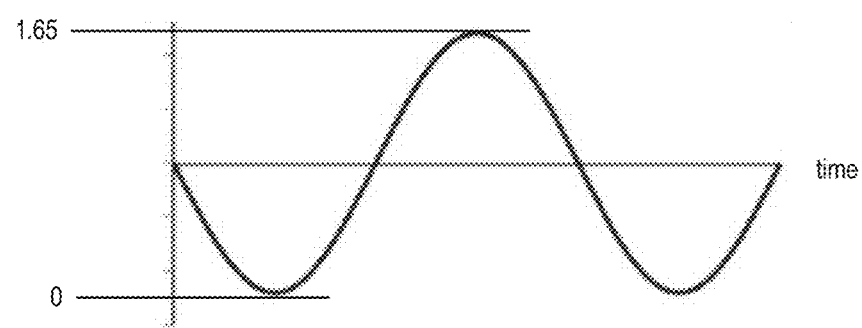
Figure 3C:
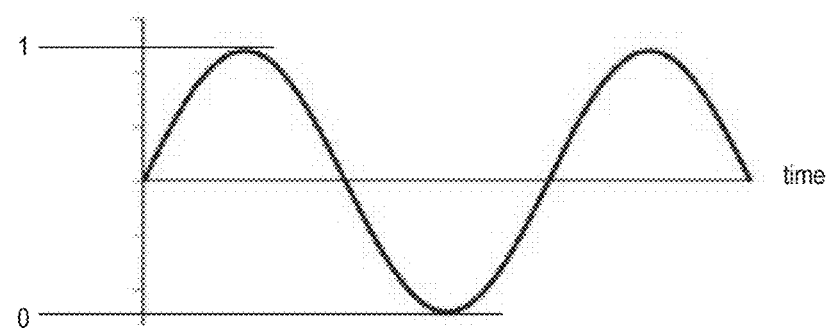

FIG. 3B illustrates another example of communication system 302 in which high voltage circuit 308 includes a differential power amplifier (e.g., power amplifier 150 of FIG. 1C), and a balun transformer 360 is provided in place of electromagnetic device 112. Balun transformer 360 includes windings 362, 364, and 366. Winding 362 can connect to output ports 161a and 161b of power amplifier 150 at, respectively, ports 362a and 362b, to receive a differential signal from power amplifier 150. Winding 364 is connected to antenna 304 at port 364a, whereas port 364b is connected to the ground. Port 366a of winding 366 is connected to port 350 of low voltage circuit 310, whereas port 366b is connected to the drain of switch 240. Balun transformer 360 also includes a port 368, which can be connected to a DC voltage source to provide a DC bias. The DC bias can set the common mode voltage for the differential output of power amplifier 150. Winding 362 can receive a differential signal at ports 362a and 362b, and induce a single ended signal at each of windings 364 and 366. FIG. 3C illustrates an example of the voltage waveforms at ports 362a, 362b, and 366a, with the turns ratio between windings 362 and 366 set at 3.3:1, the output voltage of differential power amplifier between 0 to 1.65 v, and with DC bias at port 368 being set at 0.825 v.

Figure 4:
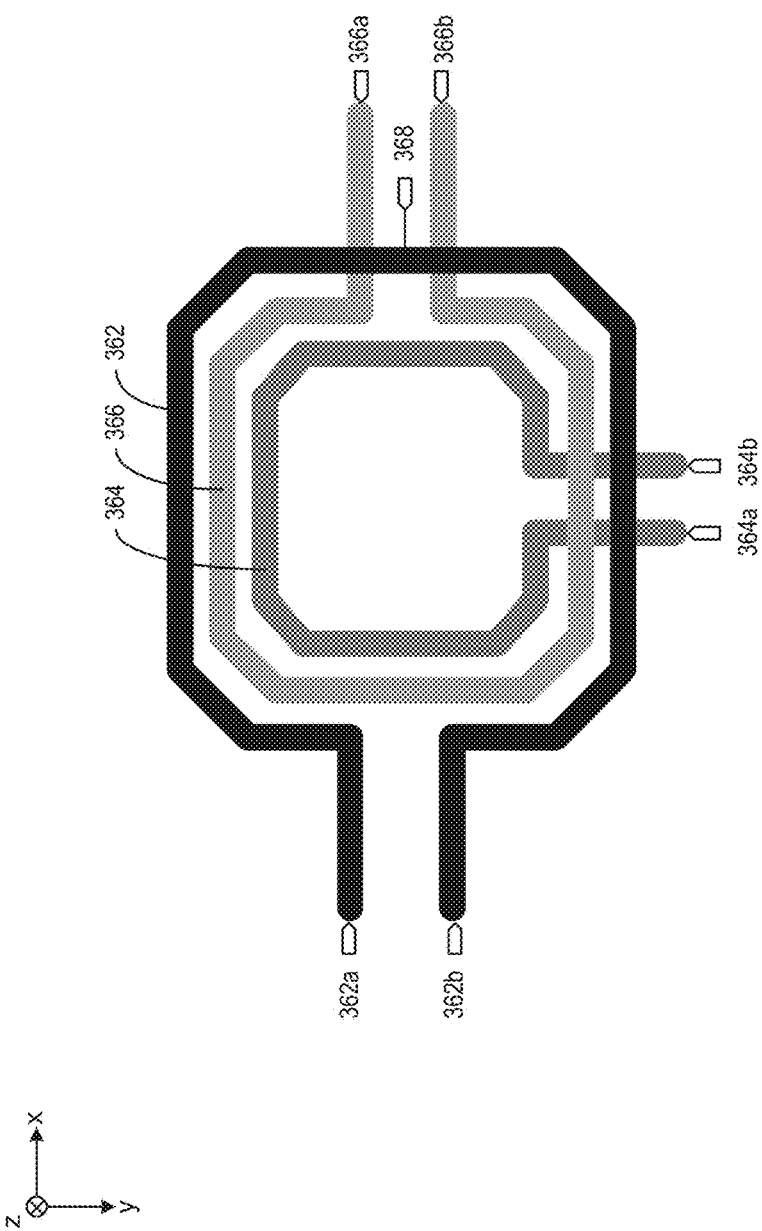
FIG. 4 illustrates an example of a layout structure of a transformer used in a bi-directional communication system, according to certain aspects of the disclosure.

FIG. 4 illustrates an example of a layout structure of balun transformer 360. Windings 362, 364, and 366 can be part of a stack structure, with each winding implemented with a certain metal layer. In the example of FIG. 4, Winding 362 can be on the on the topmost metal layers, winding 364 can be part of middle metal layers, and winding 366 can be part of bottom metal layers. Part of winding 362 can overlay on top of winding 364, whereas part of winding 364 can overlay on top of winding 366. The windings are arranged so that they are co-centric along the x-y plane, where an alternating voltage applied to one of the windings can induce a magnetic flux that flows along the z-direction. The magnetic flux flowing along the z-direction will induce voltage and current on other windings. Although FIG. 4 illustrates each of windings 362, 364, and 366 as a single winding, it is understood that each of these windings can comprise multiple stacked windings (along the z-axis) in its respective metal layers. As an illustrative example, winding 362 may be constructed with metals from three metal layers, to form a stacked three-winding coil.

Figure 5:
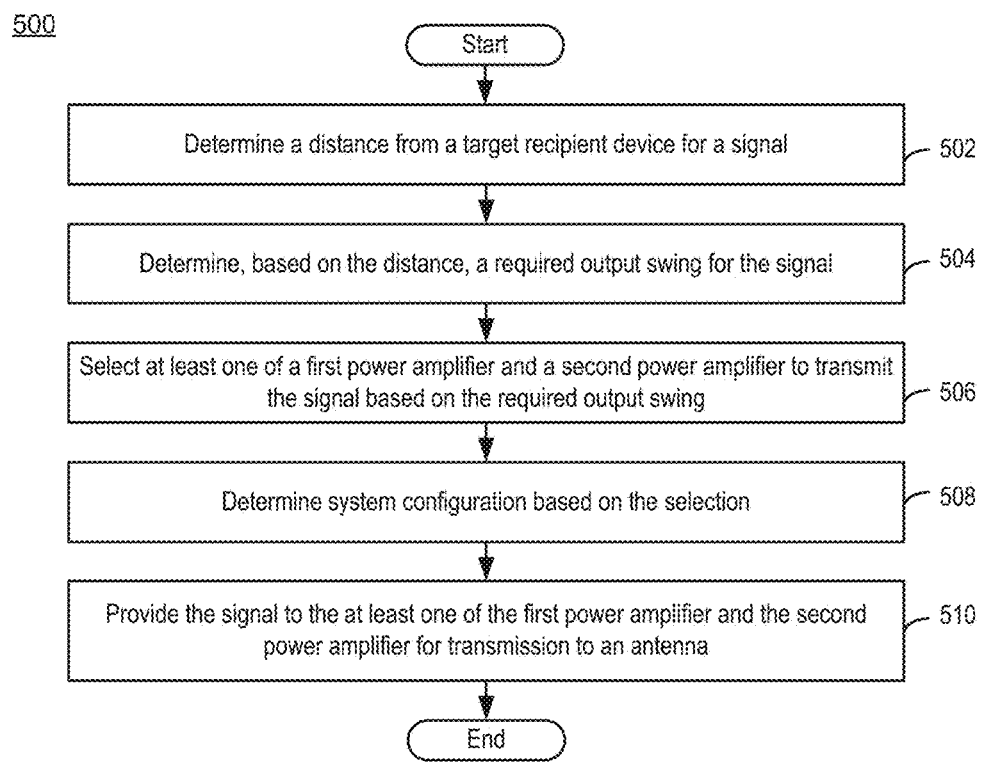
FIG. 5 illustrate s an example of a process for transmitting radio signals, according to certain aspects of the disclosure.

FIG. 5 illustrates an example flow diagram of a process 500 for performing bi-directional wireless communication, according to certain aspects of the present disclosure. Process 500 may be implemented by various systems described above, such as, for example, controller circuit 306, in performing wireless communication with second communication system 120 of FIG. 1A. Controller circuit 306 and second communication system 120 can be a part of BLE system, or other short-range communication system.

At operation 502, the system determines a distance from a target recipient device for a signal. The target recipient device can be second communication system 120. The determination can be based on, for example, RSSI information provided by the target recipient device.

At operation 504, the system determines, based on the distance, a required output swing for the signal. For example, based on the distance, the system can determine FSPL. Based on the FSPL, the system can determine the expected received radio signal powers at the recipient device for the available output swings. The system can select the output swing corresponding to an expected received radio signal power that exceeds a threshold, as the required output swing.

At operation 506, the system selects one of a first power amplifier (e.g., power amplifiers 140 or 150) and a second power amplifier (e.g., low voltage power amplifier 340) to transmit the signal based on the required output swing. For example, if 0-3.3 v voltage swing is needed, the system selects power amplifiers 140 or 150 to transmit the signal. On the other hand, if 0-1 v voltage swing is needed, the system systems low voltage power amplifier 340 to transmit the signal.

At operation 508, the system determines configurations based on the selection. For example, if 0-3.3 v voltage swing is needed, the system can disable low voltage power amplifier 340, or provide a static signal input to low voltage power amplifier 340. The system can also disable switch 240. On the other hand, if 0-1 v voltage swing is needed, the system can disable power amplifiers 140 (or 150), or provide a static signal input to the power amplifiers. The system can also enable switch 240. The system then transmit data to the selected amplifier for transmission to antenna 304, at operation 510.

It is noted that even though FIG. 5 describes an example process as sequential operations, some of the operations may be performed in parallel or concurrently. For example, in some embodiments, operations 530 and 532 may be performed in parallel. An operation may have additional steps not included in the figure. Some operations may be optional, and thus may be omitted in various embodiments. Some operations may be performed together with other operations. Furthermore, embodiments of the methods may be implemented in hardware, software, firmware, middleware, microcode, hardware description languages, or any combination thereof.

Figure 6:
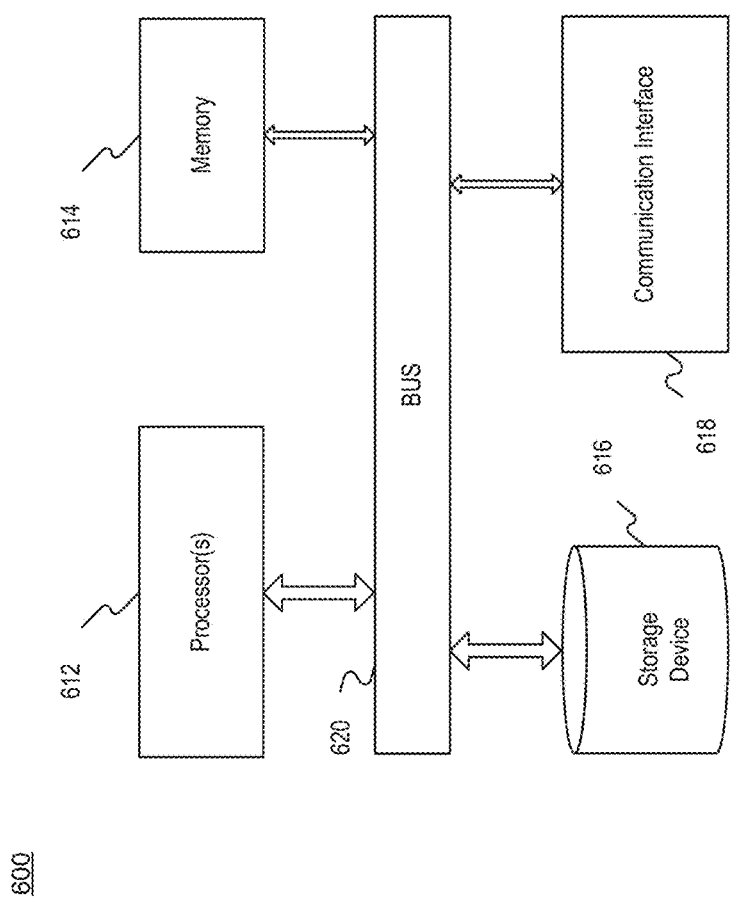
FIG. 6 illustrates an example of a computing device used for implementing components of a bi-directional communication system, according to certain aspects of the disclosure.

FIG. 6 illustrates an example of a computing system 600 which can be used to implement controller circuit 106 (of FIG. 1A) and controller circuit 306 (of FIG. 3A), according to the disclosure. As illustrated in FIG. 6, computing system 600 can include one or more processors 612, a memory device 614, a storage device 616, and a communication interface 618, all of which can communicate with each other via a bus 620.

Memory device 614 can be a random access memory (RAM) or other volatile storage devices for storing information and instructions to be executed by processors 612. Memory device 614 also can be used for storing temporary variables or other intermediate information during execution of instructions to be executed by processors 612. Such instructions, after being stored in non-transitory storage media accessible to processors 612 (e.g., storage device 616), render computing system 600 into special-purpose machines that are customized to perform the operations specified in the instructions. The instructions can be organized into different software modules, which can include, by way of example, components, such as software components, object-oriented software components, class components and task components, processes, functions, fields, procedures, subroutines, segments of program code, drivers, firmware, microcode, circuitry, data, databases, data structures, tables, arrays, and variables. The software components In general, the word "module," as used herein, refers to logic embodied in hardware or firmware, or to a collection of software instructions, possibly having entry and exit points, written in a programming language, such as, for example, Java, Lua, C or C++. A software module can be compiled and linked into an executable program, installed in a dynamic link library, or written in an interpreted programming language such as, for example, BASIC, Perl, or Python. It will be appreciated that software modules can be callable from other modules or from themselves, and/or can be invoked in response to detected events or interrupts. Software modules configured for execution on computing devices can be provided on a computer readable medium, such as a compact disc, digital video disc, flash drive, magnetic disc, or any other tangible medium, or as a digital download (and can be originally stored in a compressed or installable format that requires installation, decompression, or decryption prior to execution). Such software code can be stored, partially or fully, on a memory device of the executing computing device, for execution by the computing device. Software instructions can be embedded in firmware, such as an EPROM. It will be further appreciated that hardware modules can be comprised of connected logic units, such as gates and flip-flops, and/or can be comprised of programmable units, such as programmable gate arrays or processors. The modules or computing device functionality described herein are preferably implemented as software modules, but can be represented in hardware or firmware. Generally, the modules described herein refer to logical modules that can be combined with other modules or divided into sub-modules despite their physical organization or storage.

Computing system 600 can implement the techniques described herein using customized hard-wired logic, one or more ASICs or FPGAs, firmware and/or program logic which in combination with the computer system causes or programs computing system 600 to be a special-purpose machine. According to some embodiments, the operations, functionalities, and techniques and other features described herein are performed by computing system 600 in response to processors 612 executing one or more sequences of one or more instructions contained in, respectively, memory 614. Such instructions can be read into memory 614 from another storage medium, such as storage device 616. Execution of the sequences of instructions contained in memory 614 cause processors 612 to perform the process steps described herein, such as process 500 of FIG. 5. In alternative embodiments, hard-wired circuitry can be used in place of or in combination with software instructions.

The term "non-transitory media" as used herein refers to any non-transitory media for storing data and/or instructions that cause a machine to operate in a specific fashion. Such non-transitory media can comprise non-volatile media and/or volatile media. Non-volatile media can include, for example, optical or magnetic devices, such as storage device 616. Volatile media can include dynamic memory, such as memory 614. Common forms of non-transitory media include, for example, a floppy disk, a flexible disk, hard disk, solid state drive, magnetic tape, or any other magnetic data storage medium, a CD-ROM, any other optical data storage medium, any physical medium with patterns of holes, a RAM, a PROM, and EPROM, a FLASH-EPROM, NVRAM, any other memory chip or cartridge, and networked versions of the same.

Communication interface 618 can provide a bi-directional data communication. The interface may include circuitries that interface with, for example, power amplifiers 140, 150, and 340, as well as low noise amplifier 180. The circuitries may include, for example, frequency converters (e.g., mixers), analog-to-digital converters, symbol encoders and decoders, etc.

The specification and drawings are, accordingly, to be regarded in an illustrative rather than a restrictive sense. It will, however, be evident that various modifications and changes may be made thereunto without departing from the broader spirit and scope of the disclosure as set forth in the claims.

Other variations are within the spirit of the present disclosure. Thus, while the disclosed techniques are susceptible to various modifications and alternative constructions, certain illustrated embodiments thereof are illustrated in the drawings and have been described above in detail. It should be understood, however, that there is no intention to limit the disclosure to the specific form or forms disclosed, but on the contrary, the intention is to cover all modifications, alternative constructions, and equivalents falling within the spirit and scope of the disclosure, as defined in the appended claims.

The use of the terms "a" and "an" and "the" and similar referents in the context of describing the disclosed embodiments (especially in the context of the following claims) are to be construed to cover both the singular and the plural, unless otherwise indicated herein or clearly contradicted by context. The terms "comprising," "having," "including," and "containing" are to be construed as open-ended terms (i.e., meaning "including, but not limited to,") unless otherwise noted. The term "connected" is to be construed as partly or wholly contained within, attached to, or joined together, even if there is something intervening. Recitation of ranges of values herein are merely intended to serve as a shorthand method of referring individually to each separate value falling within the range, unless otherwise indicated herein and each separate value is incorporated into the specification as if it were individually recited herein. All methods described herein can be performed in any suitable order unless otherwise indicated herein or otherwise clearly contradicted by context. The use of any and all examples, or exemplary language (e.g., "such as") provided herein, is intended merely to better illuminate embodiments of the disclosure and does not pose a limitation on the scope of the disclosure unless otherwise claimed. No language in the specification should be construed as indicating any non-claimed element as essential to the practice of the disclosure.

Disjunctive language such as the phrase "at least one of X, Y, or Z," unless specifically stated otherwise, is intended to be understood within the context as used in general to present that an item, term, etc., may be either X, Y, or Z, or any combination thereof (e.g., X, Y, and/or Z). Thus, such disjunctive language is not generally intended to, and should not, imply that certain embodiments require at least one of X, at least one of Y, or at least one of Z to each be present.

Various embodiments of this disclosure are described herein, including the best mode known to the inventors for carrying out the disclosure. Variations of those embodiments may become apparent to those of ordinary skill in the art upon reading the foregoing description. The inventors expect skilled artisans to employ such variations as appropriate and the inventors intend for the disclosure to be practiced otherwise than as specifically described herein. Accordingly, this disclosure includes all modifications and equivalents of the subject matter recited in the claims appended hereto as permitted by applicable law. Moreover, any combination of the above-described elements in all possible variations thereof is encompassed by the disclosure unless otherwise indicated herein or otherwise clearly contradicted by context.

What is claimed is:

1. An apparatus comprising:
a transformer including a first winding, a second winding, and a third winding;
a first transmitter circuit coupled with the first winding; and
a second circuit comprising at least a second transmitter circuit and coupled with the second winding;
wherein:
the third winding is coupled with an antenna;
the first transmitter circuit is configured to transmit a first signal to the antenna via magnetic coupling between the first winding and the third winding;
the second circuit is configured to tolerate without damage a second signal from the first transmitter circuit, wherein the second signal is generated from the first signal via magnetic coupling between the first winding and the second winding;
the second transmitter circuit is configured to transmit a third signal to the antenna via magnetic coupling between the second winding and the third winding; and
a turn ratio between the first winding and the second winding is configured to limit a voltage of the second signal to be within a pre-determined threshold.

2. The apparatus of claim 1, wherein the second circuit comprises at least a receiver circuit; wherein the receiver circuit is configured to receive a fourth signal from the antenna via magnetic coupling between the second winding and the third winding.

3. The apparatus of claim 2, wherein the second circuit further comprises a switch between the second winding and a ground node; wherein the switch is turned off to disconnect the second winding from the ground node when the first transmitter circuit transmits the first signal.

4. The apparatus of claim 1, wherein the second circuit further comprises a switch between the second winding and a ground node; wherein the switch is turned off to disconnect the second winding from the ground node when the first transmitter circuit transmits the first signal.

5. The apparatus of claim 4, wherein the first transmitter circuit is configured to transmit the first signal as a first varying signal with a first maximum voltage; wherein the second transmitter circuit is configured to transmit the third signal as a second varying signal with a second maximum voltage; wherein the first maximum voltage is larger than the second maximum voltage.

6. The apparatus of claim 1, wherein the transformer is a balun transformer; and wherein the first transmitter circuit comprises a fully differential output stage.

7. The apparatus of claim 1, wherein the pre-determined threshold is set based on a maximum voltage of the first signal and an operational voltage of second circuit.

8. The apparatus of claim 7, wherein the operational voltage is determined based on a predetermined voltage stress tolerance of transistor devices of the second circuit.

9. An apparatus comprising:
a transformer including a first winding, a second winding, and a third winding, the third winding being coupled with an antenna;
a first transmitter circuit coupled with the first winding;
a second circuit comprising at least a second transmitter circuit and coupled with the second winding; and
a controller circuit configured to:
determine a distance from the apparatus to another device;
determine a target strength of a first signal to be transmitted at the antenna based on the distance;
select, based on the target strength, the first transmitter circuit to transmit the first signal;
transmit data representing a first signal to the first transmitter circuit to enable the first transmitter circuit to transmit the first signal to the antenna via magnetic coupling between the first winding and the third winding;

wherein:

the second circuit is configured to tolerate without damage a second signal from the first transmitter circuit, wherein the second signal is generated from the first signal via magnetic coupling between the first winding and the second winding;

the second transmitter circuit is configured to transmit a third signal to the antenna via magnetic coupling between the second winding and the third winding; and a turn ratio between the first winding and the second winding is configured to limit a voltage of the second signal to be within a pre-determined threshold.

10. The apparatus of claim 9, wherein the controller circuit is configured to determine the distance based on receives signal strength information (RSSI) received from the another device.

11. The apparatus of claim 10, wherein the controller circuit is configured to: determine a free-space path loss (FSPL) ratio based on the distance;

determine a required output swing based on the FSPL and a required received signal strength; and select the first transmitter circuit based on the required output swing.

12. The apparatus of claim 9, wherein the second circuit further comprises a receiver circuit coupled with the second winding.

13. The apparatus of claim 12, wherein the second circuit further comprises a switch between the second winding and a ground node; and wherein the switch is turned off to disconnect the second winding from the ground node when the first transmitter circuit transmits the first signal.

14. The apparatus of claim 9, wherein the first transmitter circuit is configured to transmit the first signal as a first varying signal with a first maximum voltage;

wherein the second circuit is configured to transmit the third signal or receive the second signal as a second varying signal with a second maximum voltage; and wherein the first maximum voltage is larger than the second maximum voltage.

15. The apparatus of claim 9, wherein the transformer is a balun transformer; and wherein the first transmitter circuit comprises a fully differential output stage.

16. The apparatus of claim 9, wherein the pre-determined threshold is set based on a maximum voltage of the first signal and an operational voltage of second circuit.

17. The apparatus of claim 16, wherein the operational voltage is determined based on a predetermined voltage stress tolerance of transistor devices of the second circuit.

18. A method of transmitting radio signals, the method being performed by a communication system comprising a transformer, a first transmitter circuit, a second circuit comprising at least a second transmitter circuit, the transforming including a first winding, a second winding, and a third winding, the first transmitter circuit coupled with the first winding, the second circuit coupled with the second winding, the third winding coupled with an antenna, the method comprising: determining a distance from the communication system to another device; determining a target strength of a first signal to be transmitted at the antenna based on the distance; selecting, based on the target strength, the first transmitter circuit to transmit a first signal; transmitting first data representing a first signal to the first transmitter circuit to control the first transmitter circuit to transmit the first signal to the antenna via magnetic coupling between the first winding and the third winding, wherein the first signal causes a second signal to be generated at the second circuit via magnetic coupling between the first winding and the second winding, and wherein a turn ratio between the first winding and the second winding limits a voltage of the second signal to be within a pre-determined threshold: and transmitting second data representing a third signal to the second circuit to control the second transmitter circuit to transmit a third signal to the antenna via magnetic coupling between the second winding and the third winding.

19. The method of claim 18, further comprising: receiving received signal strength information (RSSI) from the another device via the second circuit and via the second winding; wherein the distance is determined based on the RSSI.

* * * * *